(12) United States Patent
Anapolsky

(10) Patent No.: US 11,402,212 B2
(45) Date of Patent: Aug. 2, 2022

(54) BIOMAGNETIC SENSOR

(71) Applicant: Toyota Research Institute, Inc., Los Altos, CA (US)

(72) Inventor: Abraham S. Anapolsky, San Mateo, CA (US)

(73) Assignee: Toyota Research Institute, Inc., Los Altos, CA (US)

( * ) Notice: Subject to any disclaimer, the term of this patent is extended or adjusted under 35 U.S.C. 154(b) by 1026 days.

(21) Appl. No.: 15/934,107

(22) Filed: Mar. 23, 2018

(65) Prior Publication Data

US 2019/0293428 A1 Sep. 26, 2019

(51) Int. Cl.
*G01C 21/08* (2006.01)
*G01R 33/035* (2006.01)

(52) U.S. Cl.
CPC ......... *G01C 21/08* (2013.01); *G01R 33/0354* (2013.01)

(58) Field of Classification Search
CPC .... G01C 21/08; G01C 21/20; G01R 33/0094; G01R 33/0354; G01R 33/26
See application file for complete search history.

(56) References Cited

U.S. PATENT DOCUMENTS

| | | | | |
|---|---|---|---|---|
| 5,889,091 A | * | 3/1999 | Ziolo | B82Y 25/00 |
| | | | | 252/62.56 |
| 2010/0223797 A1 | * | 9/2010 | Peczalski | G01B 7/30 |
| | | | | 33/355 R |
| 2014/0308757 A1 | * | 10/2014 | Ju | G01C 19/56 |
| | | | | 438/3 |
| 2015/0097553 A1 | | 4/2015 | Kranck | |
| 2017/0363694 A1 | * | 12/2017 | Boysel | G01R 33/0286 |
| 2019/0277638 A1 | * | 9/2019 | Larsen | G01C 21/025 |

OTHER PUBLICATIONS

Prozorov, Tanya, et al. ("Novel magnetic nanomaterials inspired by magnetotactic bacteria: Topical review." Materials Science and Engineering: R: Reports 74.5 (2013): 133-172. (Year: 2013).*
Walcott, C. et al., "Homing of magnetized and demagnetized pigeons," J. Exp. Biol., 134, pp. 27-41 (1988).

(Continued)

*Primary Examiner* — Son T Le
*Assistant Examiner* — Adam S Clarke
(74) *Attorney, Agent, or Firm* — Christopher G. Darrow; Darrow Mustafa PC

(57) ABSTRACT

Motor vehicles use biomagnetic sensors to determine global position by detecting Earth's geomagnetic field. Magnetosensitive bioparticles, such as magnetotactic bacteria or organelles from a magnetoreceptive eukaryotic species, are dispersed in a gel medium. The magnetosensitive bioparticles generate a local magnetic moment that changes in response to fluctuations in the immediate geomagnetic field vector, the latter of which is dependent on global position. An integrated circuit, such as an array of superconducting quantum detects changes in the local magnetic moment, and a controller thereby determines the ambient geomagnetic field vector. The controller accesses a database having a correlation of geomagnetic field vector and geolocation.

15 Claims, 3 Drawing Sheets

(56) References Cited

OTHER PUBLICATIONS

Chemla, Y.R., et al., "A New Study of Bacterial Motion: Superconducting Quantum Interference Device Microscopy of Magnetotactic Bacteria," Biophysical Journal, vol. 76, pp. 3323-3330 (1999).
Versluijs, J.J., et al., "Magnetoresistance of Half-Metallic Oxide Nanocontacts," Phys. Rev. Lett., 87, 02, pp. 660-661 (2001).
Shockley, J.A., "Ground Vehicle Navigation Using Magnetic Field Variation," Air Force Institute of Technology doctoral dissertation, 186 pages (2012).
Taylor, B.K., "Bioinspired magnetic reception and multimodal sensing," Biol. Cybern., 111, pp. 287-308 (2017).

* cited by examiner

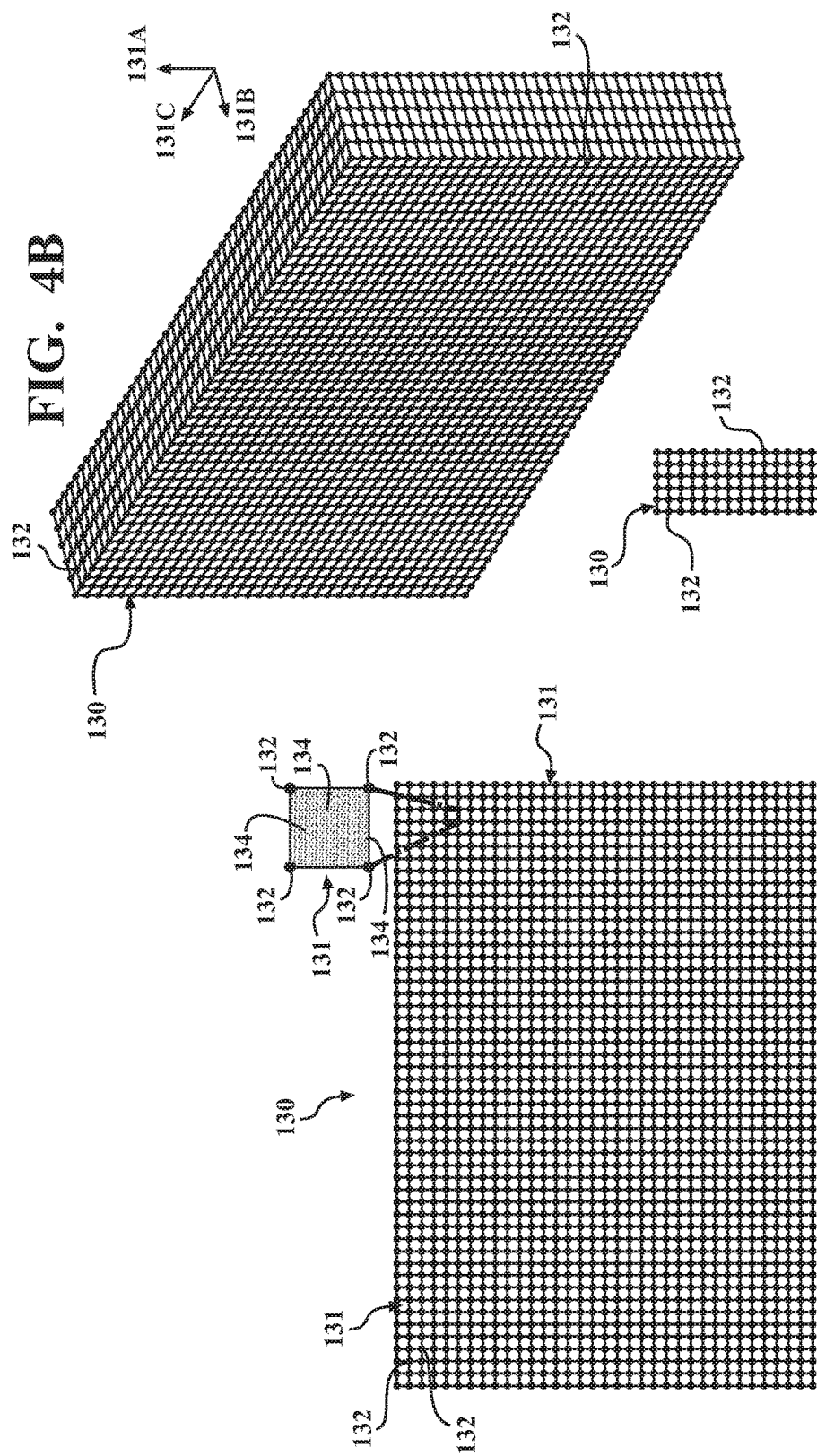

BIOMAGNETIC SENSOR

TECHNICAL FIELD

The present disclosure generally relates to magnetic devices using magnetoreceptive organisms and/or organelles and, more particularly, to such devices incorporated into motor vehicles for geolocation and navigation.

BACKGROUND

The background description provided herein is for the purpose of generally presenting the context of the disclosure. Work of the presently named inventors, to the extent it may be described in this background section, as well as aspects of the description that may not otherwise qualify as prior art at the time of filing, are neither expressly nor impliedly admitted as prior art against the present technology.

Many species, such as birds, bees, and bacteria, possess magnetoreception: the ability to detect Earth's geomagnetic field. While the mechanisms of such magnetoreception are not fully understand, the sensitivity has been shown to be impressive.

Geolocation systems using electromechanical magnetometers to detect Earth's geomagnetic field have been developed. Such systems do not require communication with a satellite.

A biomagnetic sensor utilizing the sensitivity of biological systems having magnetoreception to achieve geolocation would be desirable.

SUMMARY

This section provides a general summary of the disclosure, and is not a comprehensive disclosure of its full scope or all of its features.

In various aspects, the present teachings provide a navigation system for a motor vehicle requiring no external data source. The navigation system includes a gel medium adhered to a vehicle surface and a magnetosensitive bioparticle dispersed in the gel medium and producing a local magnetic moment in the gel medium. The navigation system also includes an integrated circuit comprising an array of magnetometers placed in proximity to the magnetosensitive bioparticles, to detect changes in the local magnetic moment, thereby detecting fluctuations in an ambient magnetic field that induce changes in the local magnetic moment. The ambient magnetic field is generally Earth's geomagnetic field.

In other aspects, the present teachings provide a biomagnetic sensor apparatus. The biomagnetic sensor apparatus includes a gel medium adhered to a vehicle surface and a magnetosensitive bioparticle dispersed in the gel medium and producing a local magnetic moment in the gel medium. The navigation system also includes an integrated circuit comprising an array of magnetometers placed in proximity to the magnetosensitive bioparticles, to detect changes in the local magnetic moment, thereby detecting fluctuations in an ambient magnetic field that induce changes in the local magnetic moment.

In yet other aspects, the present teachings provide a method for determining a current position on Earth. The method includes a step of detecting an ambient geomagnetic field vector using a magnetosensitive bioparticle dispersed in a gel medium and producing a local magnetic moment in the gel medium. The method also includes a step of indexing the ambient magnetic field vector to a database having a correlation of ambient geomagnetic field vector and geolocation. The method further includes a step of determining a current position based on the correlation.

Further areas of applicability and various methods of enhancing the disclosed technology will become apparent from the description provided herein. The description and specific examples in this summary are intended for purposes of illustration only and are not intended to limit the scope of the present disclosure.

BRIEF DESCRIPTION OF THE DRAWINGS

The present teachings will become more fully understood from the detailed description and the accompanying drawings, wherein:

FIG. 4A is a front plan view of a 3-D biomagnetometer matrix device that can be used in the navigation system of FIG. 1, with an inset showing a magnified portion of the device;

FIG. 4B is a perspective view of the device of FIG. 4A; and

FIG. 4C is a side view of the device of FIG. 4A.

It should be noted that the figures set forth herein are intended to exemplify the general characteristics of the methods and devices among those of the present technology, for the purpose of the description of certain aspects. These figures may not precisely reflect the characteristics of any given aspect, and are not necessarily intended to define or limit specific embodiments within the scope of this technology. Further, certain aspects may incorporate features from a combination of figures.

DETAILED DESCRIPTION

The present teachings provide geolocation devices and methods for determining global position that use magnetosensitive bioparticles, living organisms and/or organelles capable of detecting the geomagnetic field. Because the devices and methods determine global position on the basis of immediate ambient geomagnetic field vector, as determined by geomagnetic field-induced fluctuations in the local magnetic moment of the magnetosensitive bioparticles, the devices and methods are self-contained, in that they do not require access to any external data source, such as a GPS satellite.

The disclosed devices have a viscous carrier, such as a gel medium, with a magnetosensitive bioparticle dispersed within it. The magnetosensitive bioparticle can include intact organisms, such as magnetotactic bacteria, magnetosomes extracted from such bacteria, or eukaryotic organelles, such as magnetoreceptive organelles extracted from a magnetoreceptive species. An integrated circuit in communication with an array of highly sensitive magnetometers detects changes in the local magnetic moment that are induced by fluctuations in the immediate ambient geomagnetic field vector that are dependent on global position.

Figure 1:
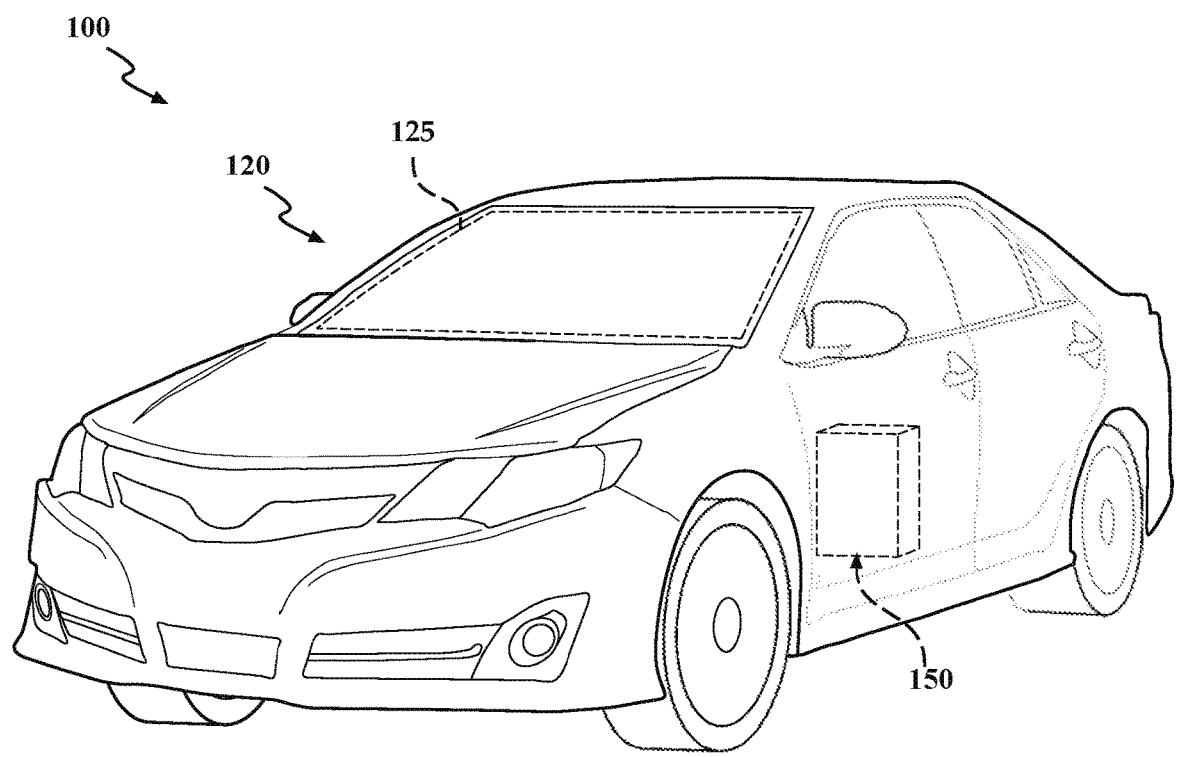
FIG. 1 is a perspective view of a vehicle having an exemplary navigation system according to the present disclosure.

FIG. 1 shows a perspective view of an automotive vehicle 100 equipped with an independent navigation system 120. While the exemplary illustration of FIG. 1 shows a land-based vehicle, it is to be understood that the vehicle 100 can also be a water-based vehicle, such as a boat, an aerial vehicle, such as an airplane, or any other vehicle that can benefit from the independent navigation system 120.

As used in this context, the term "independent" means that a navigation system 120 of the present teachings is self-contained, in that it can perform a geolocation function, comparable to that performed by a current state-of-the-art Global Positioning System (GPS), but without communicating with a satellite or the like. In some implementations, an independent navigation system 120 of the present disclosure can perform a geolocation function without communicating with any offboard computer, device, or system.

Figure 2A:
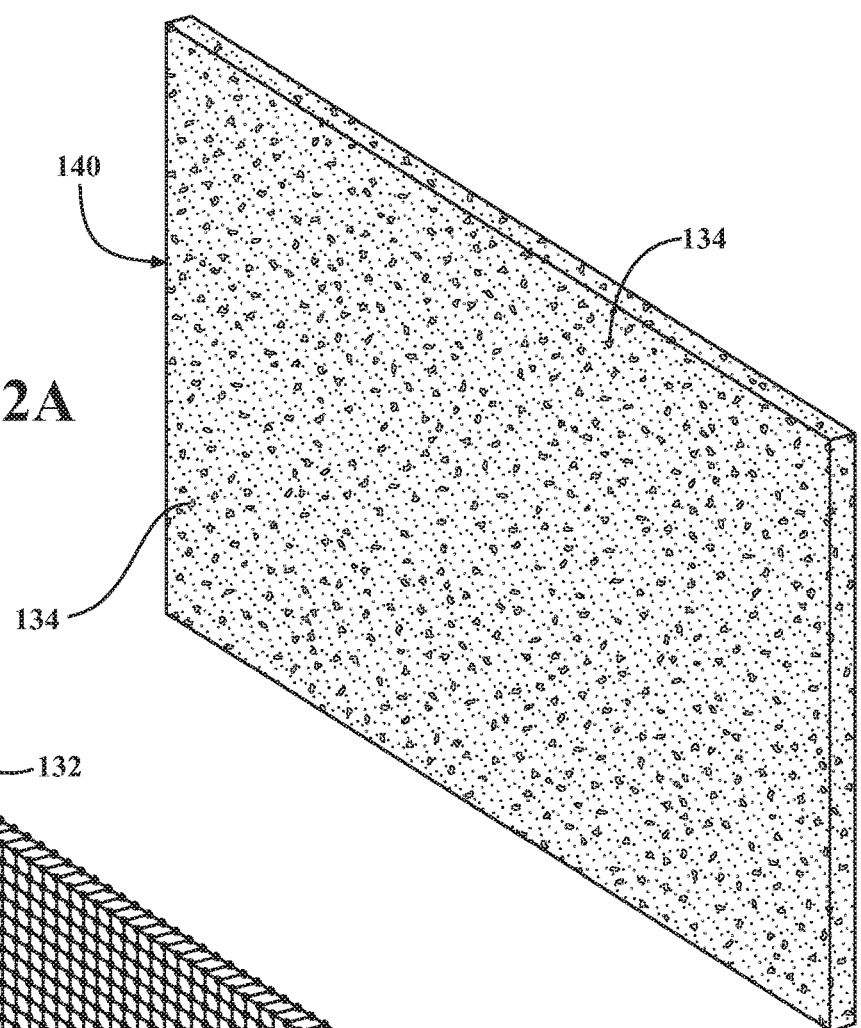
FIG. 2A is a perspective view of a gel matrix component of a biomagnetic sensor of the present teachings.
Figure 2B:
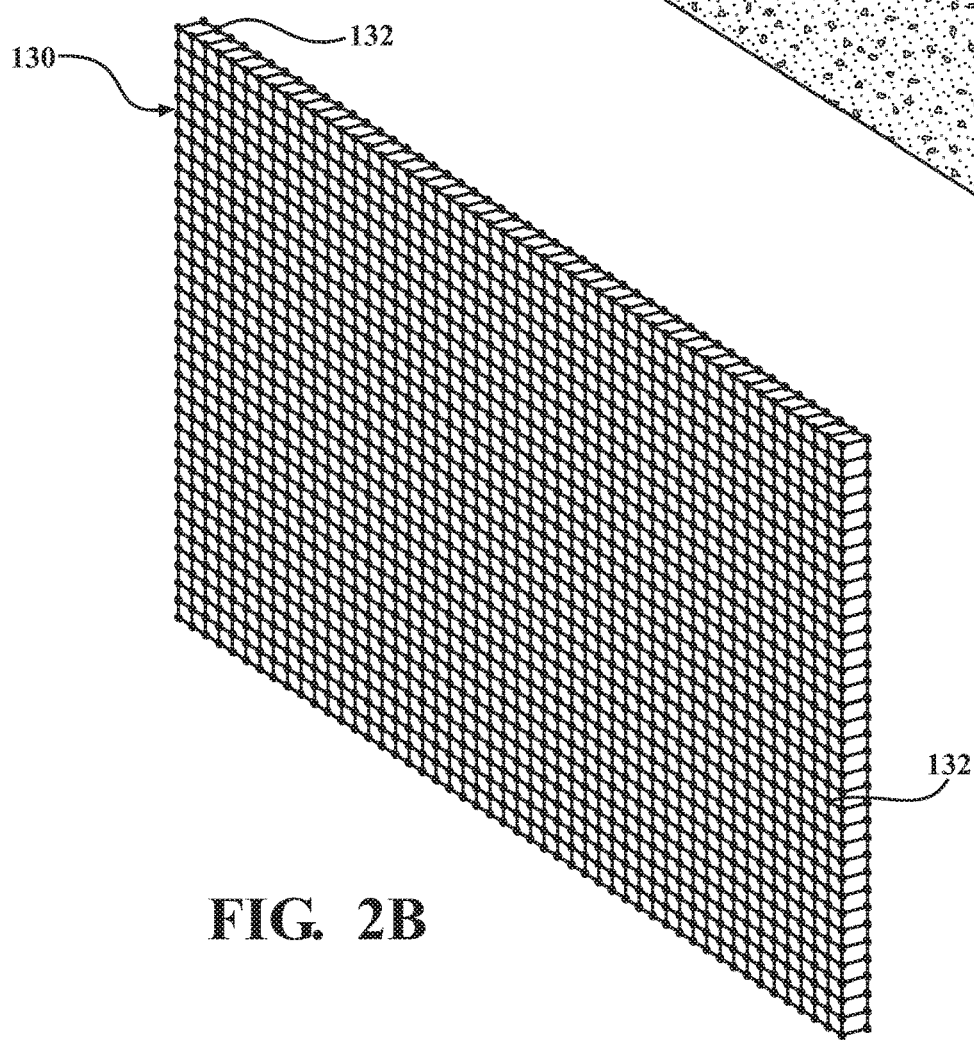
FIG. 2B is a perspective view of an integrated circuit component of a biomagnetic sensor.

The independent navigation system 120 includes a biomagnetic sensor 125 that can be deployed on any surface of the vehicle 100. In the case of the example of FIG. 1, the biomagnetic sensor 125 is deployed on the windshield, but it could be deployed on the hood, another exterior surface, or an interior surface of the vehicle 100 or a portion thereof. In some implementations, the biomagnetic sensor 125 can be deployed on a portable surface, such as a cell phone, tablet, or the like. In some implementations, the biomagnetic sensor can have a major surface having a surface area less than about 50 cm$^2$, or less than 20 cm$^2$, or less than 10 cm$^2$, or less than 5 cm$^2$. FIGS. 2A and 2B show perspective views of two components of the biomagnetic sensor 125. As shown in FIG. 2A, the biomagnetic sensor includes a carrier such as a gel medium 140 harboring a continuous suspension of magnetosensitive bioparticles 134. As used herein, the phrase "magnetosensitive bioparticle" refers to a biological structure capable of responding to the geomagnetic field or, more particularly, a biological structure having a magnetic moment that is altered by changes in an ambient geomagnetic field vector.

In some implementations, a magnetosensitive bioparticle 134 can be a magnetotactic bacterium (or colony thereof) or a magnetosome derived from a magnetotactic bacterium (such as *Magnetospirillum magneticum* or *Magnetococcus marinus*). In some implementations, a magnetosensitive bioparticle 134 can be a magnetoreceptive cell derived from a eukaryotic species, or an iron-rich organelle derived from such a cell. For example, the magnetosensitive bioparticles 134 could be biogenic magnetite containing ferrimagnetic organelles extracted from honeybee abdominal cells, magnetoreceptive pigeon neuronal cells, iron rich tortoise cells, or any other. It will be understood that in many instances, a species' biostructural basis for manifest magnetoreception is not known, but as additional biostructures that confer magnetoreception become known, they may be incorporated into the present teachings. In some implementations, extracted biogenic magnetite, devoid of any additional intracellular structure, can be a magnetosensitive bioparticle 134.

Figure 3:
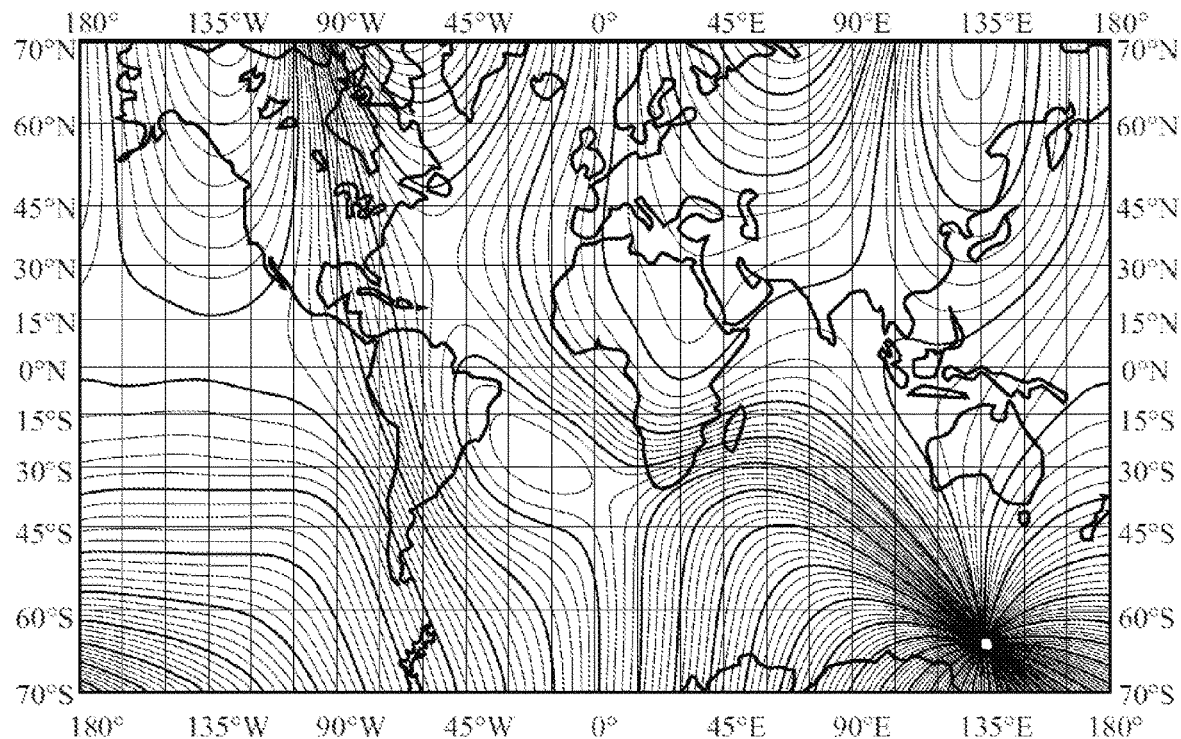
FIG. 3 is a plan view of a partial map of the Earth with overlaid magnetic declension lines, indicating magnetic field vector variability as a function of geolocation.

The phrase "ambient geomagnetic vector" refers to the ambient magnetic field that is constantly applied to the biomagnetic sensor 125, that changes in direction and intensity with changing location of the biomagnetic sensor 125, and that is predominantly attributable to Earth's geomagnetic field. FIG. 3 shows magnetic declination lines overlaid on a map of Earth, representing the difference between magnetic north and true north at different geolocations. The declination lines of FIG. 3 thus represent a partial example of variance of ambient geomagnetic field vector that a magnetosensitive bioparticle 134 entrained in a biomagnetic sensor 125 of the present disclosure will experience as a result of varying location. It is known that the direction and strength of an ambient geomagnetic field vector can change with varying surface location, as indicated by FIG. 3, but also as a function of time and altitude, and can be influenced by proximity to particular structures, including field emanating man-made structures.

The biomagnetic sensor 125 also includes an integrated circuit 131 configured to detect changes in local magnetic moment within the gel medium, said changes reflective of the magnetic moments of the magnetosensitive bioparticles 134. Thus, as the magnetic moments of the magnetosensitive bioparticles 134 continuously change in response to changes in the ambient magnetic field vector, the latter of which changes in response to location changes, the changes in magnetic moment of the magnetosensitive bioparticles 134 are detected by the integrated circuit 131. The integrated circuit 131 can include an array of magnetometers 132.

In some such implementations, an array of magnetometers 132 can be a Superconducting Quantum Interference Device (SQUID) array, an array of induction magnetometers, or a spin exchange relaxation-free (SERF) magnetometer. In some implementations, the array of magnetometers 132 can be a μ-S QUID array, i.e. an array of micro-sized SQUID. In general, the 3-D array of magnetometers will be connected by an electronic circuit, and can be connected in series or in parallel.

FIGS. 4A-4C show a front plan view, a perspective view, and a side view, respectively of an embodiment of a biomagnetic sensor 125, with emphasis on the integrated circuit 130. In some implementations, the integrated circuit can be configured to detect a scalar of the average magnetic moment of magnetosensitive bioparticles 134 entrained the in the gel medium 140 of the biomagnetic sensor 125 (i.e. field magnitude produced by the magnetosensitive bioparticles 134). In some implementations, the integrated circuit 131 can be a three-channel circuit, having three perpendicular faces 131A, 131B, and 131C, each on a separate channel of the three-channel circuit, and configured to detect a vector of the average magnetic moment of the magnetosensitive bioparticles 134 entrained the in the gel medium 140 of the biomagnetic sensor 125. The three perpendicular faces 131A, 131B, and 131C of the integrated circuit 131 correspond to axes (x, y, z) of three-dimensional Cartesian space, and facilitate measurement of the vector. It will be appreciated that in various implementations the "major surface" referred to above can correspond to any two-dimensional plane (e.g. x-y, x-z, or y-z) of FIGS. 4B and 4C.

In some implementations, the system 120 includes a database having a geolocation field vector map. The geolocation field vector map correlates ambient field vector to geolocation and is analogous to a street level map on a conventional GPS. In some implementations, the database having a geolocation field vector map can be located onboard, and in some cases the geolocation field vector map can be located offboard. The system 120 can further include a controller 150, configured to receive real-time field vector data from the biomagnetic sensor 125, to compare the received field vector data to data in the geolocation field vector map, and to determine a current location on the basis of that comparison. The controller can be configured to assume continuity of location, such continuity helping to distinguish between non-contiguous locations that may produce similar magnetic field vectors.

In some implementations, the system 120 can include an altimeter, and in some such implementations, the database can include a correlation of ambient magnetic field, altitude, and geolocation.

In some implementations, the gel medium 140 will be an aqueous gel. In some implementations, the gel medium 140 can include a nutrient source for living bacteria. For example, the gel medium in such instances could include an agar gel having a luria bertani or other nutritive mixture, such as would be found in a conventional petri dish. In some implementations, the gel medium 140 can be incorporated with a baceriostatic or bacteriocidal antibiotic, to deter growth of undesired bacteria. In some such implementation, wherein the magnetosensitive bioparticles 134 include magnetotactic bacteria, the magnetotactic bacteria can be resistant to the antibiotic employed. For example, such magnetotactic bacteria can be transfected with a vector, such as a plasmid, conferring resistance to the antibiotic employed.

In some implementations, the gel medium can be formed of a natural gel such as an agar or an agarose gel. In other implementations, the gel medium can be formed of a gel polymerized by a free radical cascade, such as a polyacrylamide gel. In some implementations, it will be desirable to configure the system 120 so that the gel medium 140 or the entire biomagnetic sensor 125 can be replaced, for example sensitivity of magnetoreception of the magnetosensitive bioparticles 134 diminishes over time, due to cell death, organelle degradation, or otherwise. In some implementations, the system can automatically perform a periodic self-test, to ascertain whether the system meets a predetermined performance threshold. In such implementations, the system may provide a notice when the self-test ascertains that performance has fallen below a predetermined level. For example, an alert could be issued when the system detects that strength of magnetic moment signal detected by the integrated circuit 131 has fallen below a threshold value, or to less than 80% of an original value. Additionally or separately, sensors directed to the gel medium 140 can determine whether gel medium 140 parameters such as pH, moisture content, or other parameters have crossed a predetermined threshold, thereby indicating that the gel medium 140 should be replaced.

A method for determining a current position on Earth is also disclosed. The method includes a step of detecting an ambient geomagnetic field vector using a magnetosensitive bioparticle 134 dispersed in a carrier such as a gel medium 140 and producing a local magnetic moment in the gel medium. The magnetosensitive bioparticle 134 can be selected from the group consisting of: magnetotactic bacteria; magnetosomes; and magnetoreceptive organelles. The magnetosensitive bioparticle 134 and the gel medium 140 are as described above. The detecting step can be performed using an integrated circuit 130 as described above.

The method also includes a step of indexing the ambient magnetic field vector to a database having a correlation of ambient geomagnetic field vector and geolocation. The database is as described above, and can optionally include a correlation of ambient geomagnetic field vector, geolocation, and altitude. In such implementations, the method can include a step of measuring altitude. In such implementations, the database is expected to include information correlating geomagnetic field vector to altitude as well as to surface position.

The preceding description is merely illustrative in nature and is in no way intended to limit the disclosure, its application, or uses. As used herein, the phrase at least one of A, B, and C should be construed to mean a logical (A or B or C), using a non-exclusive logical "or." It should be understood that the various steps within a method may be executed in different order without altering the principles of the present disclosure. Disclosure of ranges includes disclosure of all ranges and subdivided ranges within the entire range.

The headings (such as "Background" and "Summary") and sub-headings used herein are intended only for general organization of topics within the present disclosure, and are not intended to limit the disclosure of the technology or any aspect thereof. The recitation of multiple embodiments having stated features is not intended to exclude other embodiments having additional features, or other embodiments incorporating different combinations of the stated features.

As used herein, the terms "comprise" and "include" and their variants are intended to be non-limiting, such that recitation of items in succession or a list is not to the exclusion of other like items that may also be useful in the devices and methods of this technology. Similarly, the terms "can" and "may" and their variants are intended to be non-limiting, such that recitation that an embodiment can or may comprise certain elements or features does not exclude other embodiments of the present technology that do not contain those elements or features.

The broad teachings of the present disclosure can be implemented in a variety of forms. Therefore, while this disclosure includes particular examples, the true scope of the disclosure should not be so limited since other modifications will become apparent to the skilled practitioner upon a study of the specification and the following claims. Reference herein to one aspect, or various aspects means that a particular feature, structure, or characteristic described in connection with an embodiment or particular system is included in at least one embodiment or aspect. The appearances of the phrase "in one aspect" (or variations thereof) are not necessarily referring to the same aspect or embodiment. It should be also understood that the various method steps discussed herein do not have to be carried out in the same order as depicted, and not each method step is required in each aspect or embodiment.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations should not be regarded as a departure from the disclosure, and all such modifications are intended to be included within the scope of the disclosure.

What is claimed is:

1. A navigation system for a motor vehicle requiring no external data source, the navigation system comprising:
   a gel medium positioned on a surface;
   a magnetosensitive bioparticle dispersed in the gel medium and producing a local magnetic moment in the gel medium; and
   an integrated circuit comprising an array of magnetometers placed in proximity to the magnetosensitive bioparticles, to detect changes in the local magnetic moment, thereby detecting fluctuations in an ambient magnetic field that induce changes in the local magnetic moment.

2. The navigation system as recited in claim 1, wherein the integrated circuit comprises an array of superconducting quantum interference device (SQUID) sensors.

3. The navigation system as recited in claim 1, further comprising a controller configured to determine a position of the motor vehicle by accessing a data representation of a correlation of ambient magnetic field and geolocation.

4. The navigation system as recited in claim 3, further comprising an altimeter, and wherein the data representation includes a correlation of ambient magnetic field, altitude, and geolocation.

5. The navigation system as recited in claim 3, wherein the data representation is located onboard the motor vehicle.

6. The navigation system as recited in claim 1, wherein the magnetosensitive bioparticle is selected from the group consisting of:
magnetotactic bacteria;
magnetosomes; and
magnetoreceptive organelles.

7. The navigation system as recited in claim 1, wherein the ambient magnetic field is Earth's geomagnetic field.

8. A biomagnetic sensor apparatus comprising:
a gel medium harboring a continuous suspension of magnetosensitive bioparticles having a variable magnetic dipole moment vector, the variable magnetic dipole moment vector changing in response to variations in an ambient magnetic field vector; and
an integrated circuit configured to detect changes in the variable magnetic dipole moment vector, thereby detecting variations in the ambient magnetic field vector.

9. The biomagnetic sensor apparatus as recited in claim 8, wherein, the magnetosensitive bioparticles are selected from the group consisting of:
magnetotactic bacteria;
magnetosomes; and
magnetoreceptive organelles.

10. The biomagnetic sensor apparatus as recited in claim 8, wherein the integrated circuit comprises a three channel Superconducting Quantum Interference Device (SQUID) array.

11. The biomagnetic sensor apparatus as recited in claim 10, wherein the three channel SQUID array comprises a three axis SQUID array.

12. A method for determining a current position on Earth, the method comprising:
detecting an ambient geomagnetic field vector using a navigation system comprising:
a gel medium positioned on a surface;
a magnetosensitive bioparticle dispersed in the gel medium and producing a local magnetic moment in the gel medium; and
an integrated circuit comprising an array of magnetometers placed in proximity to the magnetosensitive bioparticles, to detect changes in the local magnetic moment, thereby detecting fluctuations in an ambient magnetic field that induce changes in the local magnetic moment;
indexing the ambient geomagnetic field vector to a database having a correlation of the ambient geomagnetic field vector and a geolocation; and
determining a current position based on the correlation.

13. The method as recited in claim 12, wherein the indexing is performed using a local database.

14. The method as recited in claim 12, wherein the magnetosensitive bioparticle is selected from the group consisting of:
magnetotactic bacteria;
magnetosomes; and
magnetoreceptive organelles.

15. The method as recited in claim 12, comprising:
measuring current altitude;
indexing the ambient geomagnetic field vector to the database having a correlation of ambient geomagnetic field vector, geolocation, and altitude; and
determining a current position based on the correlation of ambient geomagnetic field vector, geolocation, and altitude.

* * * * *